United States Patent [19]

Hasegawa et al.

[11] Patent Number: 4,566,079
[45] Date of Patent: Jan. 21, 1986

[54] CASSETTE-TYPE MAGNETIC-BUBBLE MEMORY APPARATUS

[75] Inventors: Hirosi Hasegawa, Suzaka; Tatsuro Onuma, Tokyo; Norio Matsubayashi, Nagano; Masayoshi Tamura, Suzaka, all of Japan

[73] Assignee: Fujitsu Limited, Kawasaki, Japan

[21] Appl. No.: 450,792

[22] Filed: Dec. 17, 1982

[30] Foreign Application Priority Data

Dec. 18, 1981 [JP] Japan .......................... 56-188693[U]

[51] Int. Cl.⁴ ............................................. G11C 19/08
[52] U.S. Cl. ...................................................... 365/1
[58] Field of Search ........................................... 365/1

[56] References Cited

U.S. PATENT DOCUMENTS 4,400,795 8/1983 Irie et al. ................................... 365/1
4,445,199 4/1984 Imazeki et al. ........................... 365/1

FOREIGN PATENT DOCUMENTS

EP27337 4/1981 European Pat. Off. ................ 365/1

OTHER PUBLICATIONS

Electronics—vol. 54, No. 9, May 5, 1981, pp. 149-151.

Primary Examiner—James W. Moffitt
Attorney, Agent, or Firm—Staas & Halsey

[57] ABSTRACT

A holder in which a bubble cassette housing a bubble memory device is inserted. The contacts of the holder contact the contacts of the cassette when the cassette is inserted into the holder, so that current can flow into the bubble memory device. The holder contains a detector for detecting the insertion and withdrawal of the cassette. A circuit controls the current introduced into the magnetic-bubble memory device so that the current is introduced after the contacts of the cassette and the contacts of the holder are connected and is interrupted before the contacts of the cassette and the contacts of the holder are disconnected.

5 Claims, 9 Drawing Figures

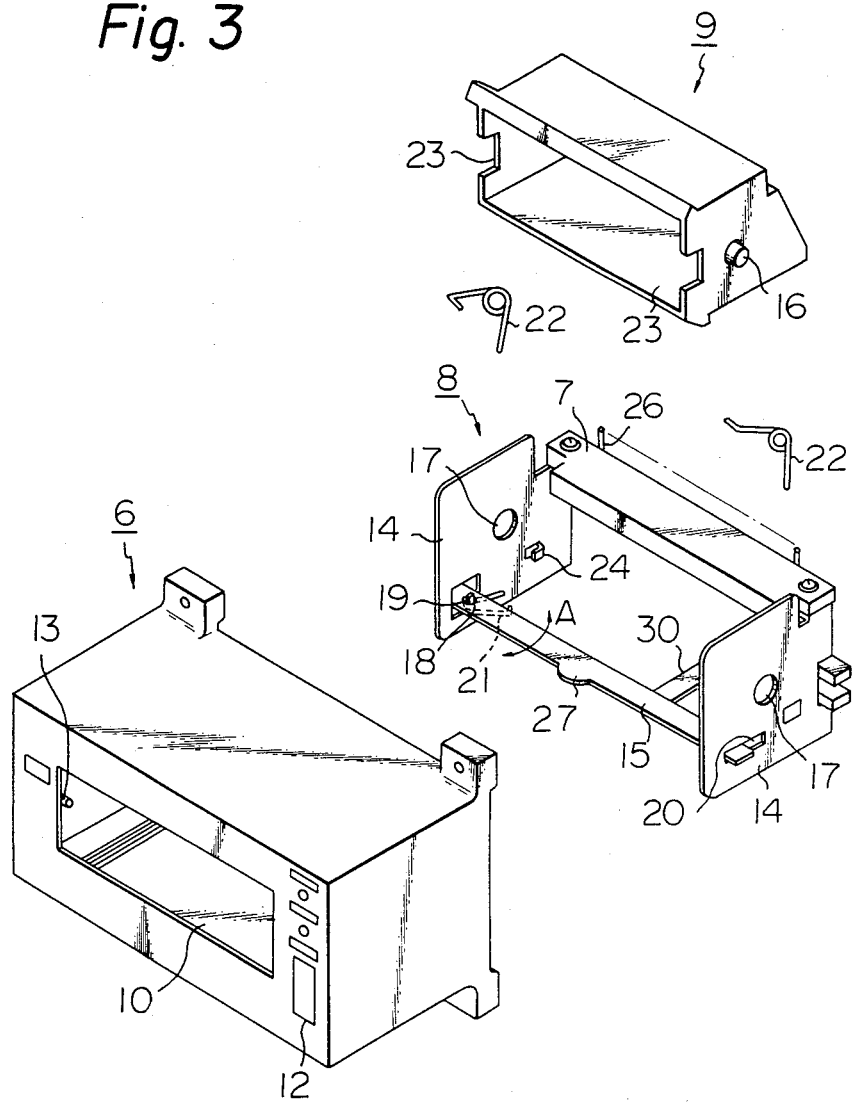

4,566,079

CASSETTE-TYPE MAGNETIC-BUBBLE MEMORY APPARATUS

FIELD OF THE INVENTION

The present invention relates to a cassette-type magnetic-bubble memory apparatus comprising a bubble cassette which houses a bubble memory device and a main apparatus which comprises a holder into which the cassette is inserted.

BACKGROUND OF THE INVENTION

The bubble memory device comprises a bubble chip which is a memory element, a coil for generating a revolving magnetic field, a magnet for generating a biased magnetic field, and a shield for protecting the device from magnetic disturbance. This magnetic memory device is housed within a bubble cassette and the bubble cassette is inserted into the holder of the main apparatus. The bubble memory device is actuated by a control circuit comprising a bubble drive circuit, a writing circuit, a reading circuit, and a power circuit in the main apparatus. The bubble memory device housed within the bubble cassette is electrically connected to the control circuit within the main apparatus by the contacts of the bubble cassette, which contacts are connected to the contacts of the holder when the bubble cassette is inserted into the main apparatus. In the prior art cassette-type magnetic-bubble memory apparatus, current is introduced into the bubble memory device at the same time that a connection is made between the contacts of the cassette and the contacts of the holder, and is interrupted at the same time that the contacts of the cassette are disconnected from the contacts of the holder. Electric noise is generated at the point of contact between the contacts of the cassette and the contacts of the holder when they are connected and when they are disconnected. In the prior art apparatus, electric noise generated at the contact is introduced into the bubble memory device, thereby causing part of the stored data to be destroyed, causing the contact to be contaminated by the minor discharge at the contact and in turn causing degradation of the reliability of the memory.

SUMMARY OF THE INVENTION

A primary object of the invention is to obviate the drawbacks of the prior art and to provide a magnetic-bubble memory apparatus in which electric noise generated at the time of connection and disconnection of the contacts of the cassette and the contacts of the holder does not effect the magnetic-bubble memory device.

A cassette-type magnetic-bubble memory apparatus according to the present invention comprises a bubble cassette which houses a bubble memory device and a main apparatus which comprises a holder into which the bubble cassette is inserted. The contacts of the holder contact the contacts of the cassette in cooperation with the action of inserting the cassette into the holder so that current flows into the bubble memory device. The present invention is characterized in that the main apparatus comprises a detecting means for detecting the action of inserting the cassette into the holder and the action of withdrawing the cassette from the holder, and in that the circuit for controlling the current introduced into the magnetic-bubble memory device is constructed so that the current is introduced after the contacts of the cassette and the contacts of the holder are connected and is interrupted before the contacts of the cassette and the contacts of the holder are disconnected.

BRIEF DESCRIPTION OF THE DRAWINGS

FIG. 3 is an exploded view of the holder of FIG. 2.

DETAILED DESCRIPTION OF THE PREFERRED EMBODIMENTS

Figure 1:
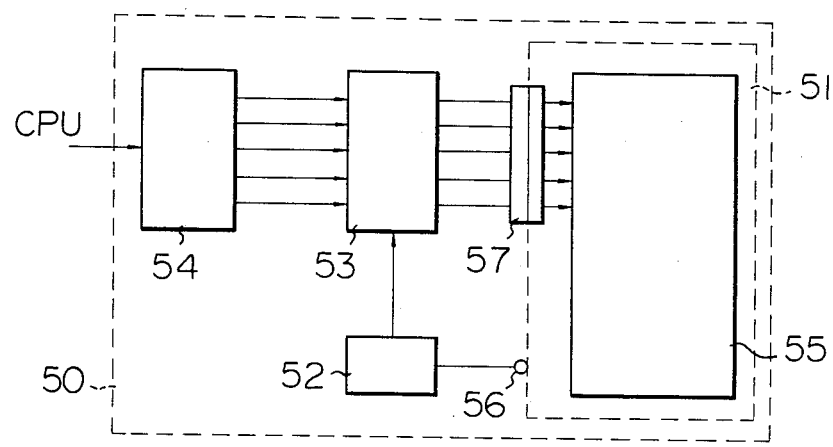
FIG. 1 is a block diagram of a cassette-type magnetic-bubble memory apparatus according to the present invention.

The present invention will now be described with reference to the accompanying drawings. FIG. 1 is a block diagram of a cassette-type magnetic-bubble memory device according to the present invention. A bubble memory device 55 housed within a bubble cassette 51 is electrically connected to an inner circuit of a main apparatus 50 by a connector 57 when the bubble cassette is inserted into the main apparatus 50. The connector 57 comprises the contacts of the bubble cassette and the contacts of the holder of the main apparatus. The inner circuit comprises a control circuit 54 which is connected to the connector 57 by a switch circuit 53. The control circuit 54 comprises a coil drive circuit, a reading circuit, a writing circuit, and a power circuit for controlling magnetic bubbles in accordance with instructions from the central processing unit (CPU). A detector circuit 52 is connected to the switch circuit 53 and is actuated by a detector 56 which detects insertion of the bubble cassette 51.

When the bubble cassette is placed in the main apparatus, the contacts of the cassette and the contacts of the holder are connected by the connector 57 before the cassette is completely inserted into the holder. When contact is made between the contacts of the cassette and the contacts of the holder, the switch circuit 53 remains open so that the control circuit 54 and the bubble memory device 55 are electrically disconnected from each other. When the cassette is completely inserted into the holder, the detector 56 detects this condition and actuates the switch circuit 53 via the detector circuit 52 so that the switch circuit 53 closes, with the result that the control circuit 54 and the bubble memory device 55 are electrically connected. In this arrangement, electric noise generated when the contacts of the bubble cassette and the contacts of the holder are connected in the connector 57 does not affect the current introduced into the bubble memory device from the control circuit since the current does not flow at the time of the coupling of the contacts of the connector 57 but flows after the contacts of the connector 57 are coupled, i.e., after the noise is diminished.

When the bubble cassette is to be withdrawn from the apparatus, the contacts of the cassette and the contacts of the holder are still connected to each other in the connector 57 at the moment of initiating withdrawal. The action of initiating withdrawal of the cassette is detected by the detector 56, which then actuates the switch circuit 53 via the detector circuit 52 so that the switch circuit 53 opens. Then the contacts of the connector 57 are disconnected in the action of withdrawing the bubble cassette. In this arrangement, electrical noise generated at the time of disconnection of the contacts of the cassette and the contacts of the holder does not affect the bubble memory device since the current introduced into the bubble memory device is cut off before the above-mentioned contacts are disconnected. The switch circuit 53 may be constructed so that it turns on and off only the power supplied to the bubble memory device 55 in response to a signal from the detector 56.

Figure 2:
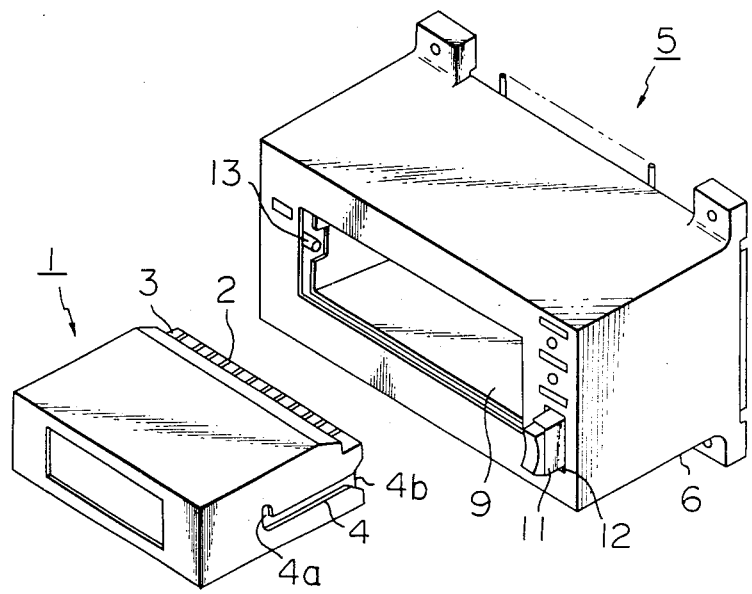
FIG. 2 is an outer view of a bubble cassette and a holder according to the present invention.

Examples of a bubble cassette and a holder of the present invention are illustrated in FIG. 2 and FIG. 3. A bubble cassette 1 comprises a connector 3 comprising a plurality of contacts 2 and being located on the upper rear end surface of the cassette. The contacts 2 are covered with a cover (not shown but explained later) when the cassette is not in the main apparatus, which comprises a holder 5. A guide groove 4 is formed on each side surface of the bubble cassette 1. A vertical groove 4a is formed at the end of the guide groove 4. The holder 5 comprises a molded plastic housing 6, a bracket 8 including a connector 7, and a molded plastic case 9 for receiving the cassette 1. The housing 6 has an opening 10 for inserting the cassette 1 into the holder and a hole 12, through which an ejection button 11 for ejecting the cassette 1 projects, on the front surface thereof. A pin 13 is disposed on both the right side and the left side of the opening 10. The pin 13 fits into the guide groove 4 of the cassette 1. The cassette 1 is inserted into the holder 5 by sliding the guide grooves 4 over the pins 13. The inlet 4b (illustrated in FIG. 2) of each guide groove 4 is wide so as to easily receive the pin 13. As is illustrated in FIG. 3, the bracket 8 comprises a pair of metal side plates 14 which are assembled together with the connector 7 and a locking lever 15 for locking the case 9 to the bracket 8. On each side plate 14 is formed a through hole 17 for receiving a projection 16 located on each side surface of the case 9. Each of the projections 16 (only one of them is illustrated) is rotatable in the through hole 17. A hole 18 is formed in one end of the locking lever 15. A projection 19 formed on one of the side plates 14 penetrates the hole 18 so that the locking lever 15 can rotate about the projection 19 as illustrated by the arrows A. The other end of the locking lever 15 slides within a slot 20 of the other side plate 14. The locking lever 15 is urged forward by a spring 21. The spring 21 has a central coiled portion into which the projection 19 is inserted. One end of the spring 21 engages the side plate 14 and the other end engages the locking lever 15 so as to push it forward.

A spring 22 is disposed on each side surface (or on one side surface) of the case 9 so that the front opening of the case 9 is urged upward when assembled together with the bracket 8 within the housing 6. The spring 22 has a central coiled portion into which the projection 16 of the case 9 is inserted. One end of the spring 22 engages a tongue 24 formed in the side plate 14 while the other end engages a recess 23 formed on the front edge of the side wall of the case 9 so as to push the front end of the case 9 upward.

Figure 5:
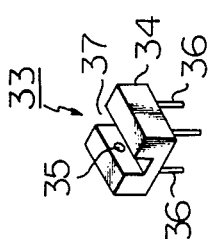
FIG. 5 is a detailed view of a photo-interrupter which cooperates with the locking lever of FIG. 4.
Figure 4:
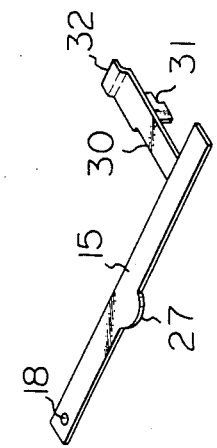
FIG. 4 is a detailed view of a locking lever used in the holder of FIG. 3.

The locking lever 15 for locking the case 9 is illustrated in detail in FIG. 4. A spring plate 30 of, e.g., stainless steel is welded to the locking lever 15 near one end thereof, which end is inserted into the slot 20 (FIG. 3) of the side plate 14 of the bracket 8. A shutter plate 31 is secured to the under side of the spring plate 30. A seat 32 on which the case 9 sits is formed at the rear end of the spring plate 30. Movement of the shutter plate 31 is detected by a photo-interrupter 33 which is illustrated in FIG. 5. The photo-interrupter 33 comprises a body 34 having a U-shaped section, a light-emitting diode 35 disposed on one inner wall of the body 34, a light-receiving diode (not shown) disposed on the other inner wall of the body 34 so that it faces the light-emitting diode 35, and lead terminals 36. The photo-interrupter 33 is secured to the housing 6 of the holder 5 in such a manner that the shutter plate 31 is disposed within a groove 37 of the U-shaped body 34. The photo-interrupter 33 controls the current introduced into the cassette so that the current flows into the cassette when the light-receiving diode receives light from the light-emitting diode 35 and is cut off when the shutter plate 31 is positioned between the light-emitting diode 35 and the light-receiving diode, with the result that the light from the light-emitting diode 35 is interrupted.

Figure 6:
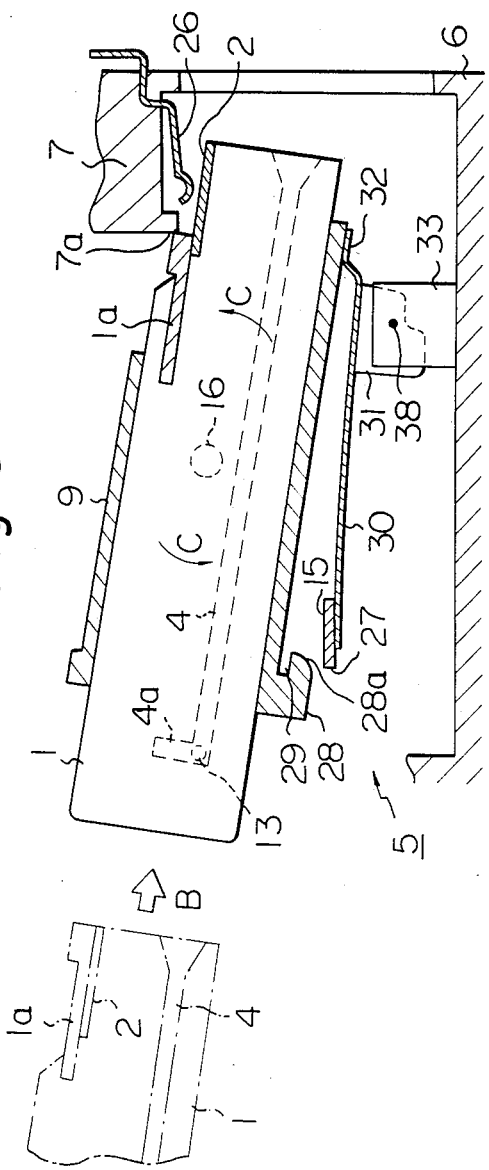
FIG. 6 is a sectional view of the cassette-type magnetic-bubble memory apparatus according to the present invention, in which the condition of the apparatus after the bubble cassette is inserted, but before the case is rotated, is illustrated.
Figure 7:
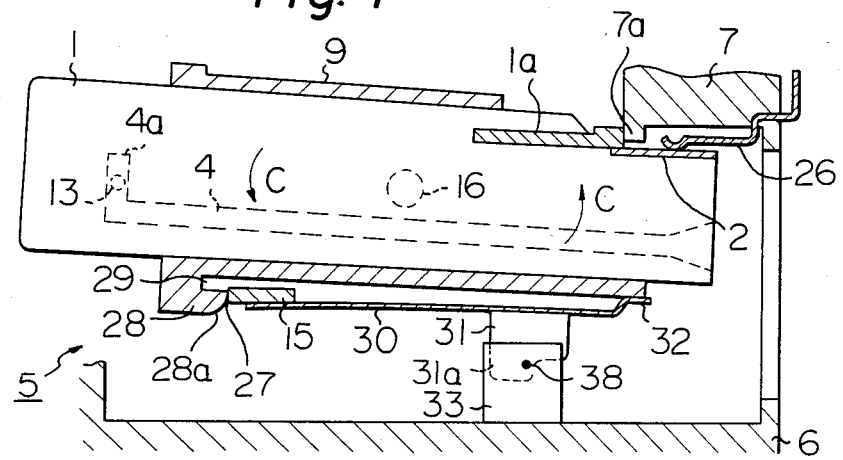
FIG. 7 is a sectional view of the apparatus of FIG. 6 in which condition of the apparatus during rotation of the case is illustrated.
Figure 8:
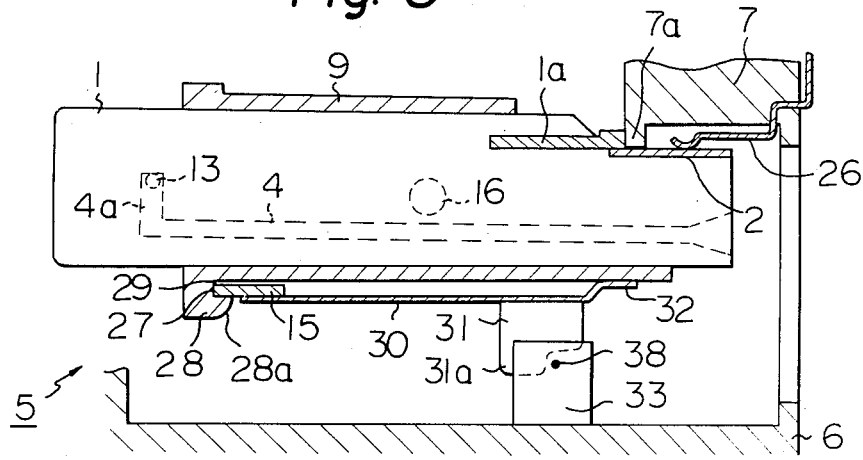
FIG. 8 is a sectional view of the apparatus of FIG. 6 showing the cassette inserted into the apparatus.

Movement of the cassette of the bubble memory apparatus of the present invention due to the insertion thereof is now explained with reference to FIGS. 6 to 8.

An operator inserts the bubble cassette 1 into the case 9 of the holder 5 in the direction of the arrow B by sliding the guide grooves 4 of the cassette 1 over the projection 13 of the housing 6. Before insertion of the cassette 1, the contacts 2 of the cassette are covered with a cover 1a, as is illustrated by the dash-dot lines in FIG. 6. The cover 1a is kept closed by a spring (not shown) when the cassette is not in the holder 5. When the cassette is inserted into the case 9, a projection 7a of the connector 7 of the holder 5 abuts against the cover 1a, causing the cover 1a to open against the closing force of the spring, and the contacts 2 of the cassette directly face the contacts 26 of the connector 7. The spring plate 30 is bent by the case 9, which sits on the seat 32, i.e., the rear end of the plate 30 is depressed. The shutter plate 31 interrupts the optical axis 38 of the light-emitting diode 35 and the light-receiving diode of the photo-interrupter 33. Then the operator pushes down the front end of the cassette 1, which end projects out of the case 9 so that the case 9 is rotated about the projection 16 on each side thereof (FIG. 3), as shown by the arrows C. In the rotation of the case 9, the contacts 2 of the cassette 1 contact the contacts 26 of the connector 7, as shown in FIG. 7. A flange 28 is provided on the underside of the case 9. The lower portion of the end 28a of the flange 28 is rounded. The rounded end 28a contacts the central projection 27 (FIG. 4) of the locking lever 15 and pushes it backward against the force of the spring 21 (FIG. 3), in cooperation with the rotational movement of the case 9. As the case 9 rotates about the projection 16, the seat 32 at the rear end of the spring plate 30 moves upward. At this time, the optical axis 38 of the photo-interrupter 33 is interrupted by a tongue portion 31a of the shutter plate 31. Therefore, current is not introduced into the cassette 1 even though the contacts 2 of the cassette and the contacts 26 of the holder are connected to each other. The vertical groove 4a of the cassette 1 slides over the projection 13 of the housing 6. The front end of the cassette 1 is pushed down further until the central projection 27 of the locking lever 15 fits into a recess 29 formed above the flange 28 due to the force of the spring 21, with the result that the case 9 is locked within the housing 6, as is illustrated in FIG. 8. Due to this locking movement of the locking lever 15, the spring plate 30 moves forward together with the shutter plate 31. Therefore, the tongue portion 31a of the shutter plate 31 is moved from the position where it covers the optical axis 38 so that the photo-interrupter 33 can introduce a current into the cassette 1 through the contacts 2 and 26. When the cassette 1 is in such a condition, it cannot be drawn forward since it is locked within the housing 6 due to the engagement of the vertical groove 4a thereof and the projection 13 of the housing 6.

When the cassette 1 is to be withdrawn from the holder 5, the ejection button 11 (FIG. 2) is pushed. When the ejection button 11 is pushed, the locking lever 15 is pushed backward and the central projection 27 of the locking lever 15 is moved out of the recess 29. Then the case 9 is rotated in a direction opposite to the direction of the arrows C by the spring 22 (FIG. 3), thereby restoring the cassette 1 to the condition illustrated in FIG. 6. When the cassette 1 is in the condition illustrated in FIG. 6, it can be withdrawn from the holder 5 since the projection 13 of the housing 6 is disengaged from the vertical groove 4a of the cassette 1.

Figure 9:
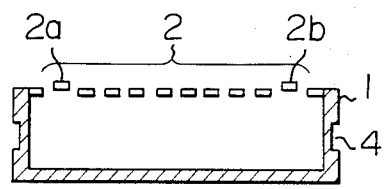
FIG. 9 is a sectional view of the cassette showing an example of the arrangement of the contacts of the cassette.

FIG. 9 shows an arrangement of the contacts 2 of the cassette 1 in which contacts 2a and 2b, which are connected to ground, are projected upward beyond the surface of other contacts. In this arrangement, the grounded contacts 2a and 2b are connected to ground before the other contacts are connected to the circuit of the main apparatus. Therefore, static electricity charged onto the surface of the cassette 1 during transportation or storage of the cassette 1 is discharged to ground through the grounded contacts 2a and 2b before the circuit of the cassette 1 is connected to the circuit of the main apparatus. Accordingly, static electricity charged onto the cassette surface does not affect operation of the bubble memory apparatus, with the result that the operational reliability thereof is enhanced.

As was mentioned above, in accordance with the present invention, the current is introduced into the cassette after the contacts of the cassette are connected to the contacts of the holder of the main apparatus and is cut off before the contacts of the cassette are disconnected from the contacts of the holder. Therefore, electric noise which is generated at the time of connection and disconnection of the contacts of the cassette and the contacts of the holder does not affect operation of the bubble memory device, with the result that the operational reliability of the apparatus is enhanced.

The present invention can be applied to a magnetic-bubble memory apparatus in which a cassette is inserted into and locked within the holder by linear insertion of the cassette without rotational movement of the cassette.

A magnetic sensor or a mechanical sensor can be used instead of a photo-interrupter as a detecting means for detecting the action of inserting and withdrawing the cassette.

We claim:

1. A cassette-type magnetic-bubble memory apparatus comprising
   a bubble cassette having contacts and which houses a bubble memory device and
   a main apparatus which comprises a holder into which said cassette is inserted, said holder having contacts which contact said contacts of said cassette in cooperation with the action of inserting said cassette into said holder so that current may flow into said bubble memory device,
   said main apparatus including a detecting means for detecting the action of inserting and withdrawing said cassette, and a circuit for controlling the current into said magnetic-bubble memory device via said contacts wherein the current begins to flow into said bubble memory device after said contacts of said cassette and said contacts of said holder are connected, and ceases to flow before said contacts of said cassette and said contacts of said holder are disconnected.

2. A cassette-type magnetic-bubble memory apparatus as set forth in claim 1, comprising
   said holder including a case for receiving said cassette,
   said case being rotatable about an axis perpendicular to the insertion direction of said cassette,
   cassette locking means for locking said cassette within said holder in cooperation with the rotation of said case, and
   case locking means for elastically locking said case at the end of the rotation of said case,
   wherein said contacts of said cassette are connected to said contacts of said holder before the rotation of said case is stopped when said cassette is being inserted into said holder, and are disconnected from said contacts of said holder after the rotation of said case is started when said cassette is to be withdrawn, and
   wherein said detecting means detects the movement of said case locking means.

3. A cassette-type magnetic-bubble memory apparatus as set forth in claim 2, comprising
   said case locking means including a shutter plate, and
   said detecting means including a photo-interrupter which has a photo-sensor and a light-emitting element disposed therein to energize the photo-sensor except when said shutter plate enters therebetween to provide said controlling of the current with the rotation of said case.

4. A cassette-type magnetic-bubble memory apparatus as set forth in claim 2, comprising
   said cassette including a cover for covering said contacts, which cover is slidable on the contact surface, and a resilient means for keeping said cover closed when said cassette is not in said main apparatus,
   wherein said cover opens in cooperation with the action of inserting said cassette, said action of inserting said cassette action against the force of said resilient means for keeping said cover closed.

5. A cassette-type magnetic-bubble memory apparatus as set forth in claim 2, said contacts of said cassette being constructed so that at least a ground line contact of said cassette is connected to a contact of said holder before the other of said contacts of said cassette are connected to the respective contacts of said holder.

* * * * *